(12) United States Patent
Li et al.

(10) Patent No.: US 11,132,011 B2
(45) Date of Patent: Sep. 28, 2021

(54) SIGNAL RECEIVING CIRCUIT AND METHOD, AND SIGNAL DETECTING CIRCUIT

(71) Applicant: SEMICONDUCTOR COMPONENTS INDUSTRIES, LLC, Phoenix, AZ (US)

(72) Inventors: Zhaohong Li, Beijing (CN); WeiMing Sun, Beijing (CN); Lei Huang, Sunnyvale, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/270,278

(22) Filed: Feb. 7, 2019

(65) Prior Publication Data

US 2019/0171242 A1    Jun. 6, 2019

Related U.S. Application Data

(63) Continuation of application No. 15/454,279, filed on Mar. 9, 2017, now Pat. No. 10,228,712.

(30) Foreign Application Priority Data

Mar. 25, 2016 (CN) .......................... 201610181665.6

(51) Int. Cl.
*H03M 5/12* (2006.01)
*G05F 1/575* (2006.01)
(Continued)

(52) U.S. Cl.
CPC .............. *G05F 1/575* (2013.01); *G05F 1/59* (2013.01); *H03K 5/08* (2013.01); *H03K 17/041* (2013.01); *H03M 5/12* (2013.01)

(58) Field of Classification Search
CPC .. G05F 1/575; G05F 1/59; H03K 5/08; H03K 17/04; H03K 17/0412; H03K 17/041; H03K 17/0416; H03K 5/12; H03M 5/12
See application file for complete search history.

(56) References Cited

U.S. PATENT DOCUMENTS 4,567,604 A    1/1986 Jacksier
5,134,632 A    7/1992 Fletcher et al.
(Continued)

FOREIGN PATENT DOCUMENTS

CN    101093983 A    12/2007
CN    102915068 A    2/2013
(Continued)

OTHER PUBLICATIONS

Notice of Allowance with English translation for Korean Application No. 10-2017-0037576, dated Nov. 19, 2020, 3 pages.

*Primary Examiner* — Jung Kim
(74) *Attorney, Agent, or Firm* — Brake Hughes Bellermann LLP

(57) ABSTRACT

This document discusses, among other things, a signal receiving circuit, configured to receive an input voltage signal. The signal receiving circuit can comprise an input voltage regulating circuit and a comparing circuit. The input voltage regulating circuit can carry out a waveform pre-regulation for the input voltage signal to obtain a first voltage signal, and the comparing circuit can compare the first voltage signal with a second voltage signal, and output a comparison voltage signal having a pulse width that satisfies a first predetermined condition indicative that the input voltage signal is correctly identifiable. The present document further discusses a signal detecting circuit and a signal receiving method.

19 Claims, 8 Drawing Sheets

(51) Int. Cl.
    *H03K 5/08*          (2006.01)
    *G05F 1/59*          (2006.01)
    *H03K 17/041*      (2006.01)

(56) References Cited

U.S. PATENT DOCUMENTS

| | | |
|---|---|---|
| 6,316,956 B1 * | 11/2001 | Oglesbee .............. H02J 7/0029 |
| | | 323/225 |
| 6,768,433 B1 | 7/2004 | Toth et al. |
| 6,933,866 B1 | 8/2005 | Weitz |
| 8,022,730 B2 | 9/2011 | Huang |
| 8,605,912 B2 | 12/2013 | Elkhatib et al. |
| 9,621,304 B2 | 4/2017 | Chard et al. |
| 2007/0297812 A1 | 12/2007 | Takeuchi et al. |
| 2009/0256792 A1 * | 10/2009 | Matsumoto .......... G09G 3/3688 |
| | | 345/94 |
| 2011/0279145 A1 | 11/2011 | Chen et al. |
| 2018/0095511 A1 | 4/2018 | Agarwal et al. |

FOREIGN PATENT DOCUMENTS

| | | |
|---|---|---|
| CN | 104980131 A | 10/2015 |
| CN | 105357819 A | 2/2016 |
| KR | 1999022525 A | 3/1999 |
| KR | 20020038789 A | 5/2002 |
| KR | 20070111453 A | 11/2007 |

\* cited by examiner

SIGNAL RECEIVING CIRCUIT AND METHOD, AND SIGNAL DETECTING CIRCUIT

RELATED APPLICATIONS

This application is a continuation application of U.S. patent application Ser. No. 15/454,279, filed Mar. 9, 2017, which claims the benefit of priority under 35 U.S.C. § 119(a) of Leon Li et al. CN Application No. 201610181665.6, filed on Mar. 25, 2016, both of which are hereby incorporated by reference in their entirety.

TECHNICAL FIELD

The present invention relates generally to electronic circuits, and more particularly to a signal receiving circuit and method, and a signal detecting circuit.

BACKGROUND

Biphase mark coding (BMC) is a coding type for use in a binary data stream, and a method of transmitting a mixture of clock signals and data signals using a presence or absence of transitions to indicate a logical value. Use of BMC improves synchronization between signals.

During data transmission, a conventional BMC receiver can function to receive a BMC data signal (e.g., an analog voltage signal) from a common collector (CC) pin, and, for example, using a digital circuit, can perform waveform shaping for a received data signal to detect whether the received BMC data signal is correct. However, in certain examples, the digital circuit can incorrectly identify the BMC data signal as a correct or incorrect signal.

The information disclosed above in the Background is merely intended to facilitate the understanding of the background of the present subject matter. Therefore, it may contain information beyond what those of ordinary skills in the art might have known about the prior art.

SUMMARY

To solve a technical problem in the related art, embodiments of the present subject matter provide a signal receiving circuit and method, and a signal detecting circuit.

An embodiment of the present subject matter can provide a signal receiving circuit configured to receive an input voltage signal. The signal receiving circuit can comprise an input voltage regulating circuit configured to provide waveform pre-regulation of the input voltage signal to obtain a first voltage signal, and a comparing circuit configured to compare the first voltage signal with a second voltage signal, and output a comparison voltage signal having a pulse width that satisfies a first predetermined condition indicative that the input voltage signal is correctly identifiable.

An embodiment of the present subject matter can provide a signal detecting circuit comprising a digital detecting circuit and a signal receiving circuit configured to receive an input voltage signal. The signal receiving circuit can comprise an input voltage regulating circuit configured to provide waveform pre-regulation of the input voltage signal to obtain a first voltage signal and a comparing circuit configured to compare the first voltage signal with a second voltage signal, and output a comparison voltage signal to the digital detecting circuit. A pulse width of the comparison voltage signal can satisfy a first predetermined condition indicative that the input voltage signal is correctly identifiable. The digital detecting circuit can be configured to detect, according to the comparison voltage signal, whether the received input voltage signal is correct.

An embodiment of the present subject matter may further provide a signal receiving method comprising receiving an input voltage signal, providing waveform pre-regulation of the input voltage to obtain a first voltage signal, and comparing the first voltage signal with a second voltage signal, and outputting a comparison voltage signal, wherein a pulse width of the comparison voltage signal satisfies a first predetermined condition indicative that the input voltage signal is correctly identifiable using the comparing circuit.

With the signal receiving circuit and method, and the signal detecting circuit according to certain embodiments of the present subject matter, a waveform pre-regulation can be provided to the input voltage signal to obtain a first voltage signal, and the first voltage signal can be compared with a second voltage signal, and a comparison voltage signal can be output, wherein a pulse width of the comparison voltage signal satisfies a first predetermined condition, the first predetermined condition indicating that the input voltage signal is correctly identifiable. The waveform pre-regulation can be provided to the input voltage signal, such that the pulse width of the output comparison voltage signal can satisfy the first predetermined condition (e.g., the input voltage signal can be correctly identified). As such, the input voltage signal can be correctly detected using the output comparison voltage signal.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following simply describes certain exemplary embodiments. Various modifications may be made to the embodiments under description without departing from the spirit or scope of the present subject matter, just as possibly known by those skilled in the art. Thus, the drawings and description are essentially considered as illustrative rather than restrictive.

In an example, a data signal received from a common collector (CC) pin can include an analog voltage signal. For ease of description, the data signal can be referred to as the analog voltage signal.

The present inventors have recognized, among other things, that in certain examples, a conventional biphase mark coding (BMC) receiver can incorrectly identify an analog voltage signal as correct or incorrect. For example, different input patterns of analog voltage signals may result in greater (as compared with the pulse width of the received input voltage signal) variations of the pulse width of the square waveform upon waveform shaping, such that a digital circuit can fail to correctly detect the analog voltage signals.

Figure 1:
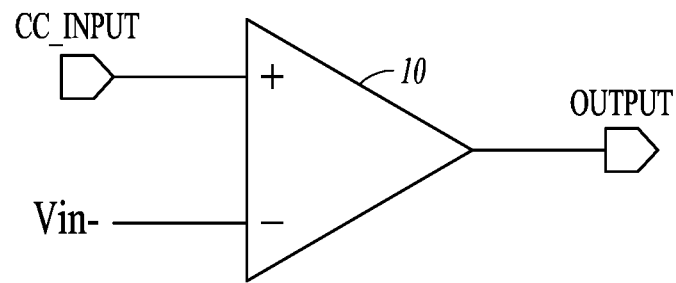
FIG. 1 illustrates a schematic diagram of a conventional BMC receiver.

FIG. 1 illustrates a schematic diagram of a conventional BMC receiver including a comparator 10 configured to receive a source analog voltage signal (CC_INPUT) (e.g., an analog voltage signal from the CC pin) at a positive input terminal, and configured to receive a reference voltage (Vin−) (e.g., a constant reference voltage) at a negative input terminal. The comparator 10 can compare the source analog voltage signal (CC_INPUT) with the reference voltage (Vin−), and can output a corresponding voltage according to a result of the comparison, thereby performing waveform shaping for the source analog voltage signal.

Figure 2:
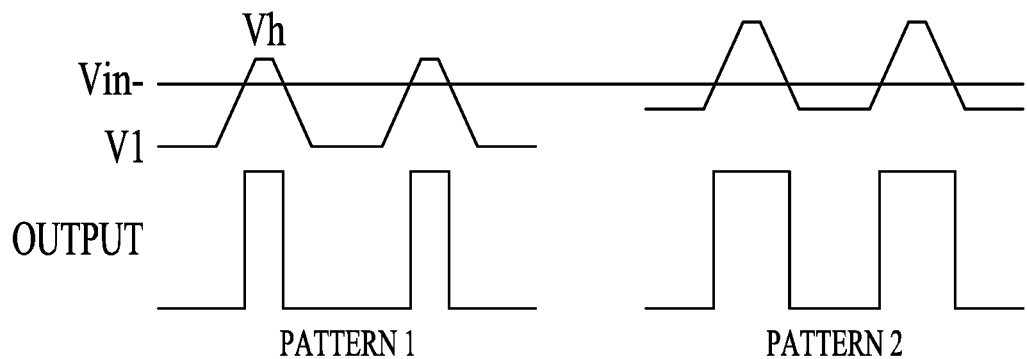
FIG. 2 illustrates a schematic diagram of an input pattern of an input voltage signal.

FIG. 2 illustrates a schematic diagram of an input pattern of an input voltage signal. In contrast to a reference voltage (Vin−) that is constant, a source analog voltage signal (CC_INPUT) is not constantly fixed, but may vary. The source analog voltage signal (CC_INPUT) may have different input patterns. A high voltage of the source analog voltage signal (CC_INPUT) can be represented using Vh, and a low voltage can be represented using Vl.

FIG. 2 comprises a first input pattern (PATTERN 1) with Vh close to the reference voltage (Vin−) and Vl lower than the reference voltage (Vin−), and a second input pattern (PATTERN 2) with Vl close to the reference voltage (Vin−) and Vh higher than the reference voltage (Vin−). In other examples, other input patterns can be used. Waveform shaping for the source analog voltage signal (CC_INPUT) can provide vastly different results, depending on, among other things, the level of voltage of one or more of the source analog voltage signal (CC_INPUT) or the reference voltage (Vin−). As seen from the respective waveforms in FIG. 2, the source analog voltage signal (CC_INPUT) in the first input pattern (PATTERN 1), upon waveform shaping, provides an output signal (OUTPUT) with a square waveform having a smaller pulse width as compared with the pulse width of the source analog voltage signal (CC_INPUT); whereas the source analog voltage signal (CC_INPUT) in the second input pattern (PATTERN 2), upon waveform shaping, provides an output signal (OUTPUT) with a square waveform having a greater pulse width. In these two input patterns, the obtained pulse widths are both subject to greater variations. Such variations may cause a digital circuit to fail to correctly detect or identify the analog voltage signal.

In various embodiments of the present subject matter, a signal receiving circuit can receive an input voltage signal, perform waveform shaping to the input voltage signals, and output an output voltage signal. When the pulse width of the output voltage signal satisfies a first predetermined condition, the first predetermined conditions can indicate that the input voltage signal is correctly identifiable.

In an example, the input voltage signal is a voltage signal having a specific frequency and different input patterns, such as illustrated in FIG. 2, including, for example, BMC data signals or the like.

It should be noted that the terms "first", "second", etc., used herein denote elements at different locations, but do not define parameters or functions of the elements.

Figure 3:
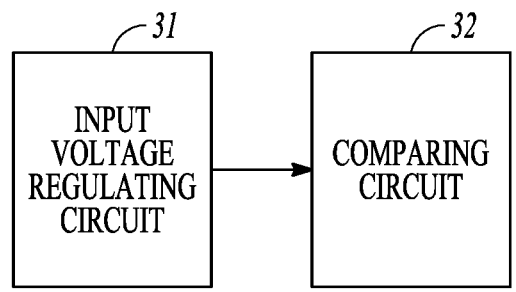
FIG. 3 illustrates a schematic diagram of a signal receiving circuit according to an embodiment.

FIG. 3 illustrates a schematic diagram of a signal receiving circuit according to an embodiment. The signal receiving circuit can receive an input voltage signal. As illustrated in FIG. 3, the signal receiving circuit may comprise an input voltage regulating circuit 31 and a comparing circuit 32.

In an example, the input voltage regulating circuit 31 can provide waveform pre-regulation to the input voltage signal to obtain a first voltage signal, and the comparing circuit 32 can compare the first voltage signal with a second voltage signal and output a comparison voltage signal. In an example, if the pulse width of the output comparison voltage signal satisfies a first predetermined condition, the input voltage signal may be correctly identifiable. In certain examples, the first predetermined condition can be indicative that the input voltage signal is correctly identifiable.

In an example, the input voltage regulating circuit 31 can perform waveform pre-regulation for the input voltage signal, such that the pulse width of the output comparison voltage signal may satisfy the first predetermined condition. For example, the input voltage signal may be correctly identified, such that it is ensured that the input voltage signal is subsequently correctly detected using the output comparison voltage signal. The input voltage signal may be identified as a correct signal or as an incorrect signal using the output comparison voltage signal.

In an example, the comparing circuit 32 can include a comparator. A positive input terminal of the comparator can receive a first voltage signal, and a negative input terminal of the comparator can receive a second voltage signal. The second voltage signal can include a reference voltage signal.

In certain examples, the input voltage regulating circuit 31 can comprise an alternating current coupling circuit configured to perform alternating current coupling for the input voltage signal to carry out the waveform pre-regulation for the input voltage signal. In an example, the alternating current coupling circuit may include only a blocking capacitor. Alternating current coupling can be performed for the input voltage signal using the blocking capacitor. In other examples, the alternating current coupling may be performed for the input voltage signal using other components (e.g., using a blocking capacitor in combination with a resistor, etc.).

Figure 4:
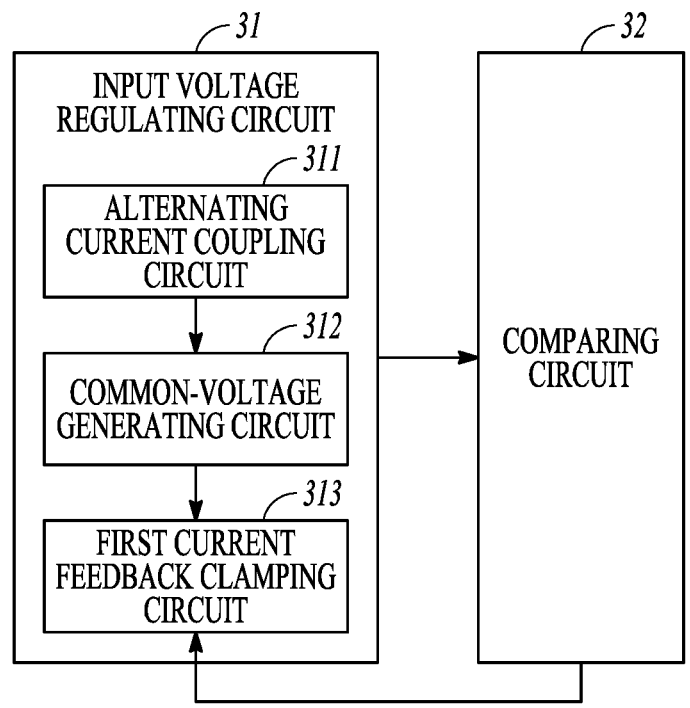
FIG. 4 illustrates a schematic diagram of a signal receiving circuit according to an embodiment.

FIG. 4 illustrates a schematic diagram of a signal receiving circuit according to an embodiment. In certain examples, various factors may impact a pulse width of the comparison voltage signal, such as process deviations or temperatures of various devices or elements in the circuit, discharging of a capacitor via a voltage divider resistor, etc. To mitigate such impacts, the input voltage regulating circuit 31 may comprise a common-mode voltage generating circuit 312 and a first current feedback clamping circuit 313, in certain examples, in addition to the alternating current coupling circuit 311.

The common-voltage generating circuit 312 can regulate the waveform of a third voltage signal by regulating the common-mode voltage of the third voltage signal to a first value, and can obtain the first voltage signal. In an example, the third voltage signal includes a voltage signal after the alternating current coupling circuit 311 performs alternating current coupling. The first current feedback clamping circuit 313 can clamp the first voltage signal by pulling up or pulling down the current of the first voltage signal using the comparison voltage signal output by the comparing circuit 32, to further regulate the waveform of the first voltage signal, such that the pulse width of the output comparison voltage signal satisfies the first predetermined condition. In an example, the voltage of the second voltage signal can be a fixed voltage value, which, in certain examples, can specifically include the first value.

The common-voltage generating circuit 312 can regulate the waveform of a third voltage signal by regulating the common-mode voltage of the third voltage signal to a first value, and can obtain the first voltage signal. In an example, the third voltage signal includes a voltage signal after the alternating current coupling circuit performs alternating current coupling. The first current feedback clamping circuit 313 can clamp the first voltage signal by pulling up or pulling down the current of the first voltage signal using the comparison voltage signal output by the comparing circuit, to further regulate the waveform of the first voltage signal, such that the pulse width of the output voltage signal satisfies the first predetermined condition. In an example, the voltage value of the second voltage signal includes the first value.

When the signal receiving circuit does not receive the input voltage signal (e.g., it may be considered that the circuit is in an idle state), the input voltage signal can be constantly a high level signal or constantly a low level signal, and the common-mode voltage generating circuit 312 may maintain the common-mode voltage of the first voltage signal to be a first value using the comparison voltage signal of the comparing circuit 32, to ensure the stability of the entire circuit.

The common-mode voltage generating circuit 312 can be further configured to maintain the common-mode voltage of the first voltage signal to be the first value using the comparison voltage signal of the comparing circuit when the signal receiving circuit does not receive the input voltage signal. The first value may be determined according to the specific implementation of the common-mode voltage generating circuit 312.

In the signal receiving circuit as illustrated in FIG. 4, the alternating current coupling circuit 311 can perform alternating current coupling for the input voltage signal to carry out a first regulation for the waveform of the input voltage signal. Subsequently, the common-mode voltage generating circuit 312 can regulate the common-mode voltage of the voltage signal experiencing the alternating current coupling to the first value, thereby performing a second regulation of the waveform of the input voltage signal. In the meantime, the first current feedback clamping circuit 313 can pull up or pull down the current of the voltage signal experiencing the second regulation using the comparison voltage signal output by the comparing circuit 32 to clamp the voltage of the voltage signal after a second regulation of the waveform, thereby further regulating the waveform of the first voltage signal. In this way, the impacts caused by the process deviations and temperatures of various devices or elements in the circuit onto the pulse width of the comparison voltage signal may be prevented, such that the pulse width of the output comparison voltage signal satisfies the first predetermined condition.

In an example, the comparing circuit 32 may be practiced by a comparator. Correspondingly, a negative input terminal of the comparator can receive the first voltage signal (the reference voltage signal), and a positive input terminal of the comparator can receive the second voltage signal. In an example, the second voltage signal includes the input voltage signal. The input voltage regulating circuit 31 can comprise a filtering circuit configured to filter the input voltage signal to provide waveform pre-regulation.

Figure 5:
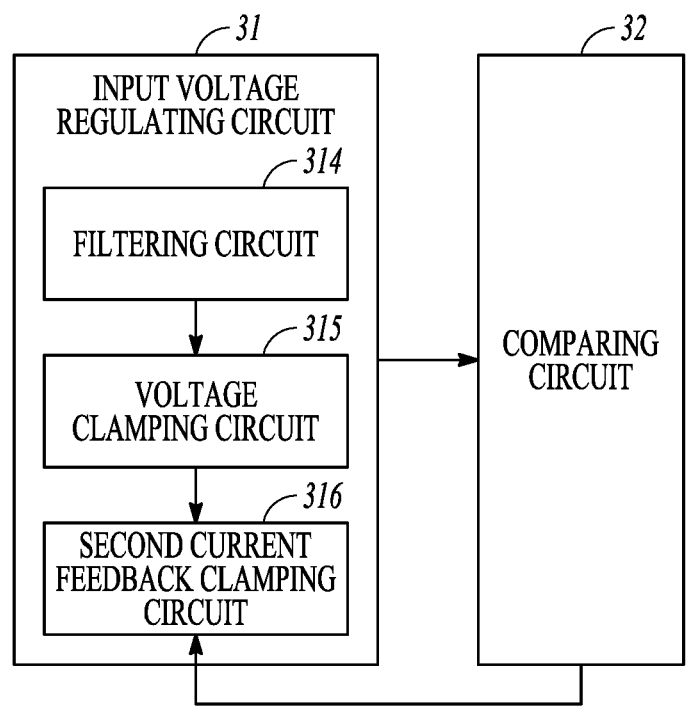
FIG. 5 illustrates a schematic diagram of a third signal receiving circuit according to an embodiment.

FIG. 5 illustrates a schematic diagram of a third signal receiving circuit according to an embodiment. In an example, the filtering circuit may be practiced by an RC filter. The RC filter can filter the input voltage signal. Nevertheless, the input voltage signal may also be filtered in one or more other manners (e.g., using an LC filter, etc.). The RC filter can include a filter formed by a resistor and a capacitor, and the LC filter can include a filter formed by an inductor and a capacitor.

In an example, to prevent impacts caused by process deviations or temperatures of various devices and elements in the circuit onto the pulse width of the comparison voltage signal, as illustrated in FIG. 5, the input voltage regulating circuit 31, in addition to the filter circuit 314, can comprise a voltage clamping circuit 315 and a second current feedback clamping circuit 316.

The voltage clamping circuit 315 can regulate the waveform of a fourth voltage signal to a predetermined range to obtain the first voltage signal, wherein the fourth voltage signal is a voltage signal obtained after the filtering circuit 314 performs filtering. The second current feedback clamping circuit 316 can pull up or pull down the current of the first voltage signal using the comparison voltage signal output by the comparing circuit 32 to clamp the first voltage signal, thereby further regulating the waveform of the first voltage signal, such that the pulse width of the output comparison voltage signal satisfies the first predetermined condition.

In an example, the voltage of the second voltage signal is not a fixed voltage value, but can vary with the voltage of the input voltage signal. The predetermined range can be determined according to the specific implementation of the voltage clamping circuit 315.

The filtering circuit 314 can perform filtering for the input voltage signal to carry out a first regulation for the waveform of the input voltage signal. Subsequently, the voltage clamping circuit 315 can regulate the voltage of the voltage signal experiencing the filtering to a predetermined range, thereby implementing a second regulation of the waveform of the input voltage signal. The second current feedback clamping circuit 316 can pull up or pull down the current of the voltage signal experiencing the second regulation using the comparison voltage signal output by the comparing circuit 32 to clamp the voltage of the voltage signal after a second regulation of the waveform, thereby further regulating the waveform of the first voltage signal. In this way, the impact caused by the process deviations or temperatures of various devices or elements in the circuit onto the pulse width of the comparison voltage signal may be prevented, such that the pulse width of the output comparison voltage signal satisfies the first predetermined condition.

Figure 6:
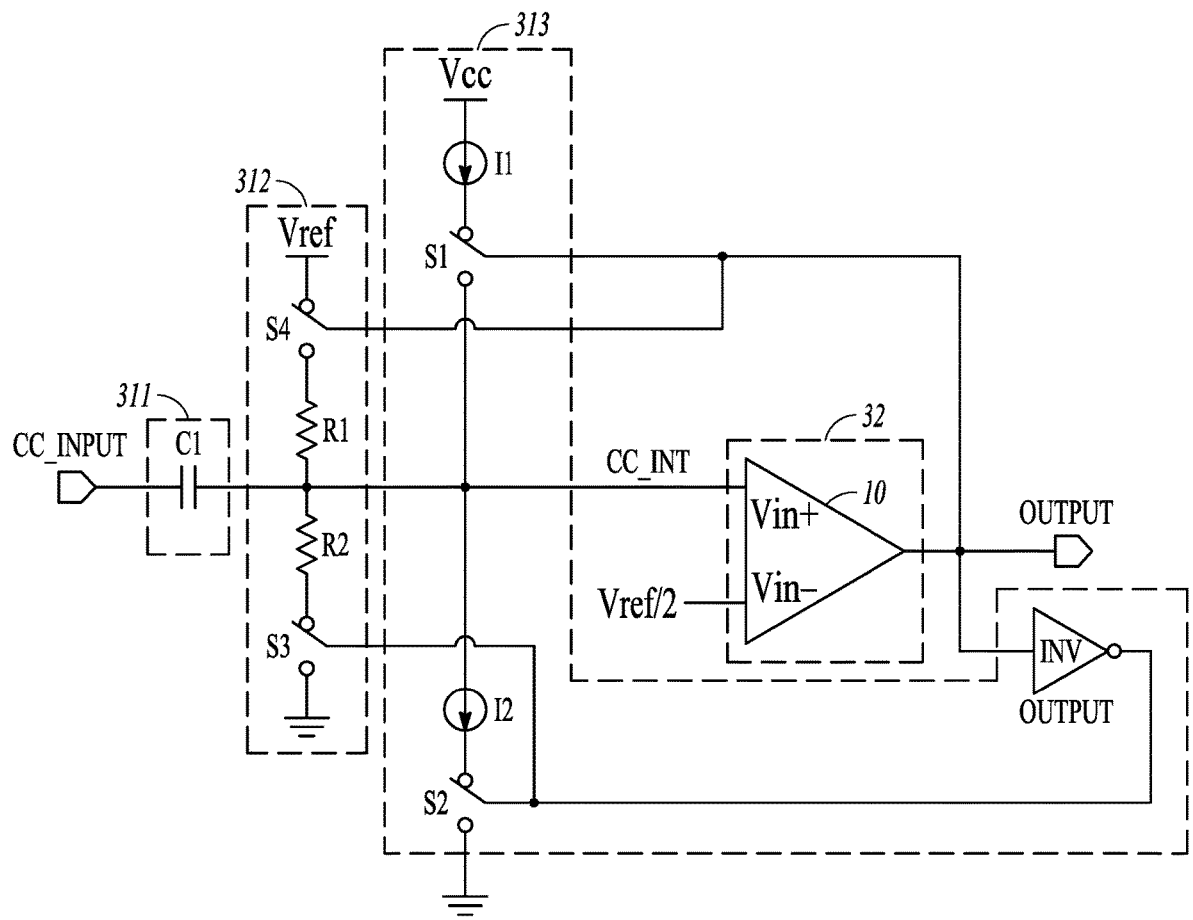
FIG. 6 illustrates a schematic diagram of a signal receiving circuit according to an embodiment.

FIG. 6 illustrates a schematic diagram of a signal receiving circuit according to an embodiment. In this embodiment, the alternating current coupling circuit 311 can comprise a first capacitor C1. The common-mode voltage generating circuit 312 can comprise a first resistor R1, a second resistor R2, a third switch S3, and a fourth switch S4. The first current feedback clamping circuit 313 can comprise a first current source I1, a second current source I2, a first switch S1, a second switch S2, and a phase inverter INV. In certain examples, the resistance of the first resistor R1 can be the same as that of the second resistor R1, and the first capacitor C1 can include a blocking capacitor.

Figure 7:
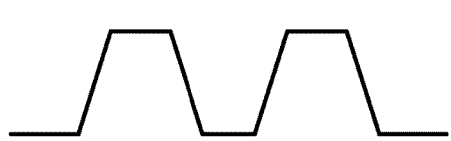
FIG. 7 illustrates an input voltage signal according to an embodiment.
Figure 8:
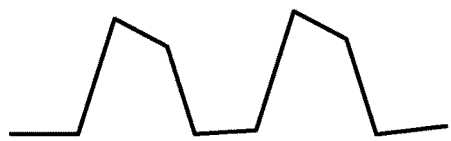
FIG. 8 illustrates an input voltage signal upon first waveform shaping according to an embodiment.
Figure 9:
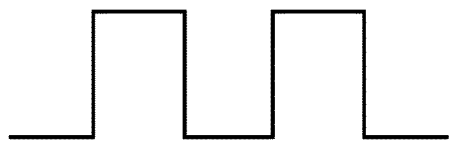
FIG. 9 illustrates an output comparison voltage signal according to an embodiment.

FIGS. 7-9 illustrate example waveforms according to various embodiments. FIG. 7 illustrates an input voltage signal (CC_INPUT) according to an embodiment. FIG. 8 illustrates an input voltage signal (CC_INPUT) upon first waveform shaping according to an embodiment. FIG. 9 illustrates an output comparison voltage signal according to an embodiment.

FIG. 7 illustrates an input voltage signal (CC_INPUT) according to an embodiment. The input voltage signal (CC_INPUT) of FIG. 7 can be applied to a signal receiving circuit, such as that illustrated in FIG. 6. The first capacitor C1, the first resistor R1, and the second resistor R2 can perform alternating current coupling to the input voltage signal (CC_INPUT), and can carry out a first regulation for the waveform of the input voltage signal (CC_INPUT) to obtain a regulated voltage signal (CC_INT), the waveform of which is as illustrated in FIG. 8. When the regulated voltage signal (CC_INT) is a high level signal, the comparing circuit 32 can output a high level signal, such that the first switch S1 is conducting, and the inverter INV can output a low level signal, such that the second switch S2 is switched off.

In an example, the first resistor R1 and the second resistor R2 can have the same resistance, such that the common voltage (Vcm) of the input voltage signal (CC_INPUT) can be constantly maintained to be half of the first reference voltage (Vref) and will not change with the change of the input pattern of the input voltage signal (CC_INPUT). Conduction of the first switch S1 can result in the first current source I1 (e.g., which provides a small current) pulling up the current of the high voltage signal, as illustrated in FIG. 8, such that the high level of the voltage signal is maintained at a constant value to carry out a second regulation for the waveform of the input voltage signal (CC_INPUT). In this way, when the comparing circuit 32 compares the regulated voltage signal (CC_INT) with the second reference voltage signal (e.g., Vref/2), a correct high level signal can be output.

When the input voltage signal (CC_INPUT) is a low level signal, the comparing circuit 32 can output a low level signal, such that the first switch S1 is switched off, and the low level signal output by the comparing circuit 32 can change to be a high level signal under the effect of the phase inverter INV, such that the second switch S2 conducts. When the first resistor R1 and the second resistor R2 have the same resistance, the common voltage (Vcm) of the voltage signal (CC_INPUT) can be constantly maintained to be half (Vref/2) of the first reference voltage (Vref) and does not change with the change of the input pattern (such as, for example, the two input patterns as illustrated in FIG. 2) of the input voltage signal (CC_INPUT). Conduction of the second switch S2 can result in the second current source I2 (e.g., which provides a small current) pulling down the current of the low voltage signal as illustrated in FIG. 8, such that the low level of the voltage signal as illustrated in FIG. 8 is maintained at a constant value to carry out a second regulation for the waveform of the input voltage signal (CC_INPUT). In this way, when the comparing circuit 32 compares the regulated voltage signal (CC_INT) with the second reference voltage signal (e.g., Vref/2), a correct low level signal can be output.

In certain examples, the circuits or waveforms disclosed herein can cause mutual effects to each other, such that the comparing circuit 32 can output a voltage signal (OUTPUT) such as illustrated in FIG. 9.

In operation, the third switch S3 and the fourth switch S4 of FIG. 6 can both be in a conducting state. When the input voltage signal (CC_INPUT) is constantly in a high level state, such as a duration exceeding a defined value (e.g., 20 μs), the fourth switch S4 can be switched off, and the third switch S3 can be in a conduction state. When the input voltage signal (CC_INPUT) is constantly in a low level state, such as a duration exceeding a defined value (e.g., 20 μs), the third switch S3 can be switched off, and the fourth switch S4 can be in a conduction state. As such, the stability of the circuit can be maintained.

As illustrated in the circuit of FIG. 6, regardless of which input pattern the input voltage signal (CC_INPUT) employs, since the common-mode voltage is constant, and by means of the feedback of the output voltage signal (OUTPUT), the current of the voltage signal (CC_INPUT) is pulled up or pulled down. As such, the impacts caused by the process deviations and temperatures of various devices or elements onto the pulse width of the comparison voltage signal may be prevented, such that the pulse width of the output comparison voltage signal satisfies the first predetermined condition. The input voltage signal (CC_INPUT) may be correctly identified using the comparison voltage signal. In certain examples, regardless of which input pattern the input voltage signal (CC_INPUT) employs, if the pulse width does not change, an output voltage signal having substantially the same pulse width as the input voltage signal (CC_INPUT) may be output using the signal receiving circuit such as illustrated in FIG. 6. In this way, it can be ensured that the input voltage signal (CC_INPUT) may subsequently be correctly identified.

Figure 10:
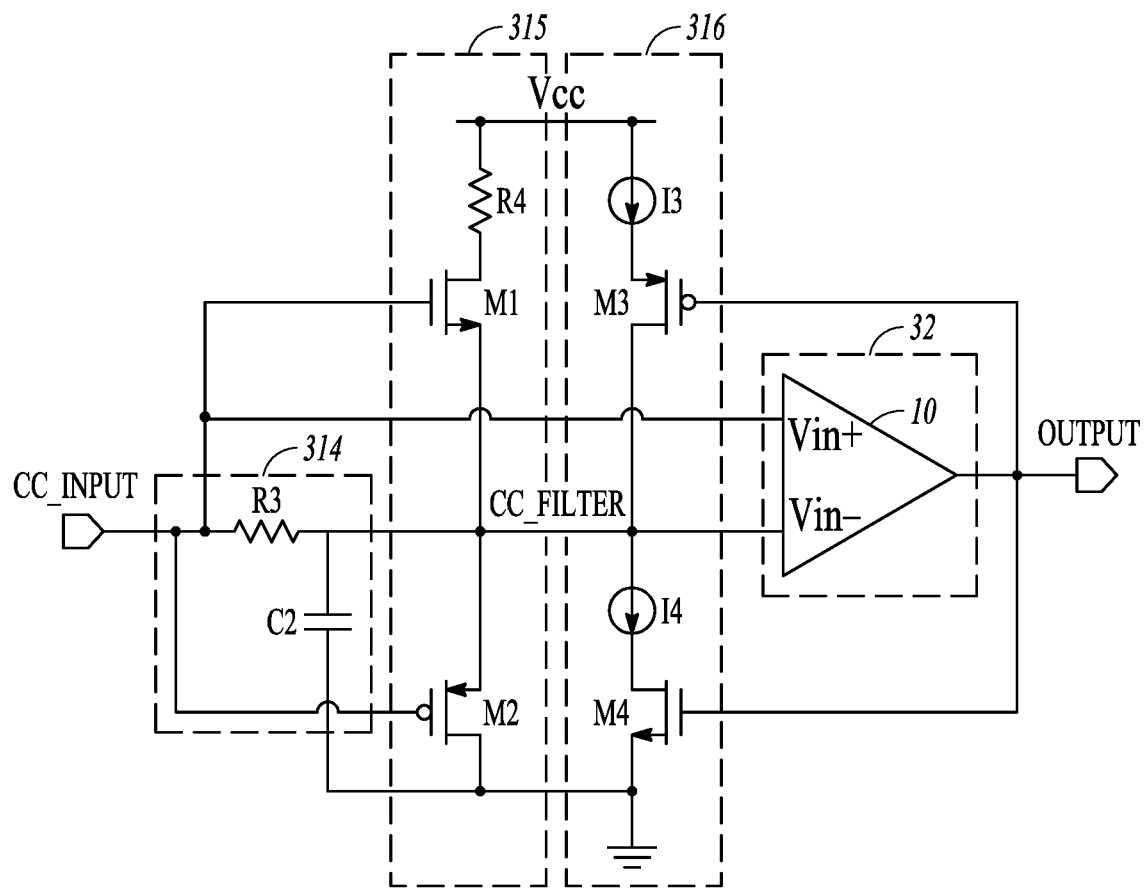
FIG. 10 illustrates a schematic diagram of a signal receiving circuit according to an embodiment.

FIG. 10 illustrates a schematic diagram of a signal receiving circuit according to an embodiment. In this example, the filtering circuit 314 can comprise a second capacitor C2 and a third resistor R3. The voltage clamping circuit 315 can comprise a fourth resistor R4, a first P-channel metal-oxide semiconductor field-effect transistor (PMOS) M1, and a first N-channel metal-oxide semiconductor field-effect transistor (NMOS) M2. The second current feedback clamping circuit 316 can comprise a third current source (I3), a fourth current source I4, a second NMOS M3, and a second PMOS M4.

FIG. 7 illustrates an input voltage signal (CC_INPUT) according to an embodiment. The input voltage signal (CC_INPUT) of FIG. 7 can be applied to a signal receiving circuit, such as that illustrated in FIG. 10. The second capacitor R2 and the third resistor R3 can filter the input voltage signal (CC_INPUT) and carry out a first regulation for the waveform of the input voltage signal (CC_INPUT) to obtain an adjusted voltage signal (CC_FILTER), such as a first waveform shaping signal illustrated in FIG. 11.

Figure 11:
FIG. 11 illustrates a first waveform shaping of an input voltage signal according to an embodiment.

FIG. 11 illustrates a first waveform shaping of an input voltage signal according to an embodiment. When the input voltage signal (CC_INPUT) is a high level signal, the comparing circuit 32 can output a high level signal, such that the first NMOS M1 and the second NMOS M4 are conducting (e.g., between a source and a drain, etc.) and the first PMOS M2 and the second PMOS M3 are not conducting. Conduction of the first NMOS M1 can cause the voltage (Vcc_FILTER) of the voltage signal (CC_FILTER) to be clamped with the input pattern of the input voltage signal (CC_INPUT). Vcc_FILTER can be greater than Vh-VGSM1. Vh can denote a high level signal of the input voltage signal (CC_INPUT). VGSM1 can denote a gate source voltage of the first NMOS M1. Conduction of the second NMOS M4 can cause the fourth current source I4 (e.g., which provides a small current) to pull down the current of the high voltage signal, such as illustrated in FIG. 11, such that the high level of the voltage signal as illustrated in FIG. 11 maintains a constant value, which achieves an effect of further clamping the voltage (Vcc_FILTER) of the voltage signal (CC_FILTER), such that the voltage (CC_FILTER) of the voltage signal (CC_FILTER) is not too high. As such, a second regulation can be performed for the waveform of the input voltage signal (CC_INPUT). In this way, when the comparing circuit 32 compares the input voltage signal (CC_INPUT) with the input voltage signal (CC_INPUT) experiencing the second regulation (e.g., the input voltage signal (CC_INPUT) experiencing the second regulation is a reference voltage signal of the comparing circuit 32), a correct high level signal can be output.

When the input voltage signal (CC_INPUT) is a low level signal, the comparing circuit 32 can output a low level signal, such that the first PMOS M2 and the second PMOS M3 are conducting, and the first NMOS M1 and the second NMOS M4 are not conducting. Conduction of the first PMOS M2 can cause the voltage (Vcc_FILTER) of the voltage signal (CC_FILTER) to be clamped with the input pattern of the input voltage signal (CC_INPUT). Vcc_FILTER is greater than Vl-VGSM2. Vl denotes a low level signal of the input voltage signal (CC_INPUT), VGSM2 denotes a gate source voltage of the first NMOS M2. Conduction of the second PMOS M3 causes the third source I3 (e.g., which provides a small current) to pull up the current of the low voltage signal, such as illustrated in FIG. 11, such that the low level of the voltage signal as illustrated in FIG. 11 can maintain a constant value, which achieves an effect of further clamping the voltage (Vcc_FILTER) of the voltage signal (CC_FILTER), such that the voltage (CC_FILTER) of the voltage signal (CC_FILTER) is not too low. As such, a second regulation can be performed for the waveform of the input voltage signal (CC_INPUT). In this way, when the comparing circuit 32 compares the input voltage signal (CC_INPUT) with the input voltage signal (CC_INPUT) experiencing the second regulation (e.g., the input voltage signal (CC_INPUT) experiencing the second regulation is a reference voltage signal of the comparing circuit 32), a correct low level signal can be output.

In certain examples, the circuits or waveforms disclosed herein can cause mutual effects to each other, such that the comparing circuit 32 can output a voltage signal (OUTPUT) such as illustrated in FIG. 9.

As illustrated in the circuit of FIG. 10, regardless of which input pattern the input voltage signal (CC_INPUT) employs, since the reference voltage signal of the comparing circuit 32 can change with change of the input voltage signal (CC_INPUT), and by means of the feedback of the output voltage signal (OUTPUT), the current of the reference voltage signal (CC_FILTER) is pulled up or pulled down. As such, the impacts caused by the process deviations and temperatures of various devices or elements onto the pulse width of the comparison voltage signal may be prevented, such that the pulse width of the output comparison voltage signal satisfies the first predetermined condition. The input voltage signal (CC_INPUT) may be correctly identified using the comparison voltage signal. In certain examples, regardless of which input pattern the input voltage signal (CC_INPUT) employs, if the pulse width does not change, an output voltage signal having substantially the same pulse width as the input voltage signal (CC_INPUT) may be output using the signal receiving circuit such as illustrated in FIG. 10. In this way, it can be ensured that the input voltage signal (CC_INPUT) may subsequently be correctly identified.

Figure 12:
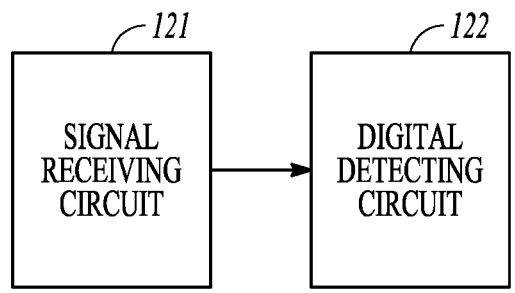
FIG. 12 illustrates a schematic diagram of a signal detecting circuit according to an embodiment.

FIG. 12 illustrates a schematic diagram of a signal detecting circuit according to an embodiment. The signal detecting circuit comprises a signal receiving circuit 121 and a digital detecting circuit 122.

The signal receiving circuit 121 can receive an input voltage signal, provide waveform pre-regulation for the input voltage signal, and output a comparison voltage signal to the digital detecting circuit 122. The digital detecting circuit 122 can detect, according to the comparison voltage signal, whether the received input voltage signal is a correct signal or an incorrect signal.

When the digital detecting circuit 122 detects, using the comparison voltage signal, that the received input voltage signal is a correct signal, the digital detecting circuit 122 may feed a good cyclic redundancy check (good CRC) result back to a control circuit. When the digital detecting circuit 122 detects, using the comparison voltage signal, that the received input voltage signal is an incorrect signal, the digital detecting circuit 122 may feed a result of incorrect signal back to the control circuit.

The specification composition and the corresponding function of the signal receiving circuit 121 have been described above, therefore they are not described herein any further.

Based on the signal detecting circuit according to the embodiment of the present subject matter, an embodiment of the present subject matter further provides an integrated circuit, which comprises the above described signal detecting circuit.

The integrated circuit may be an analog device that needs signal detection, for example, an analog chip having the power delivery (PD) function (e.g., which supports the PD power communication protocol), a device carrying out communication using the BMC data, etc.

Figure 13:
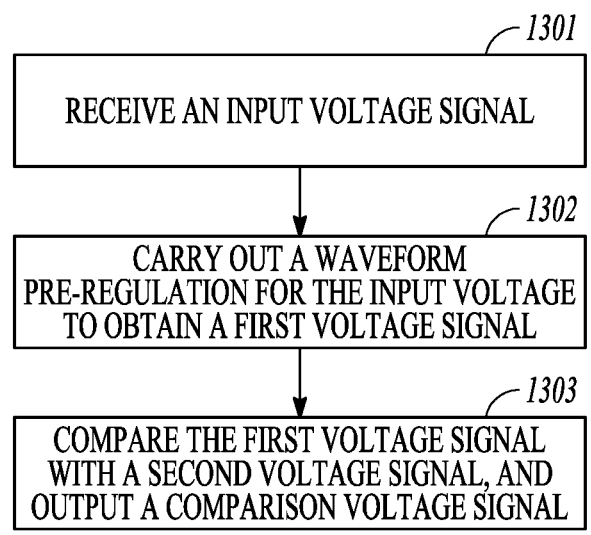
FIG. 13 illustrates a flowchart of a signal receiving method according to an embodiment.

FIG. 13 illustrates a flowchart of a signal receiving method according to an embodiment. At 1301, an input voltage signal can be received. The input voltage signal can include a voltage signal having a specific frequency and different input patterns (e.g., different patterns or the like, such as illustrated in FIG. 2, etc.). At 1302, a waveform pre-regulation can be carried out for the input voltage to obtain a first voltage signal. At 1303, the first voltage signal can be compared with a second voltage signal, and a comparison voltage signal can be output.

In an example, the pulse width of the output comparison voltage signal can satisfy a first predetermined condition indicative that the input voltage signal is correctly identifiable. In an example, the second voltage signal can include a reference voltage signal, and correspondingly, carrying out a waveform pre-regulation for the input voltage signal can comprise performing alternating current coupling for the input voltage signal to carry out the waveform pre-regulation for the input voltage signal.

In practical applications, considering that the process deviations and temperatures of various devices or elements in the circuit may cause impacts onto the pulse width of the comparison voltage signal, to prevent such impacts, when the waveform pre-regulation is carried out for the input voltage signal, the method may further comprise regulating the waveform of a third voltage signal by regulating the common-mode voltage of the third voltage signal to a first value and obtaining the first voltage signal, wherein the third voltage signal is a voltage signal upon alternating current coupling, and clamping the first voltage signal by pulling up or pulling down the current of the first voltage signal using the output comparison voltage signal, to further regulate the waveform of the first voltage signal, such that the pulse width of the output voltage signal satisfies the first predetermined condition, wherein the voltage of the second voltage signal is the first value.

When the signal receiving circuit does not receive the input voltage signal (e.g., when the circuit is in an idle state), the input voltage signal is constantly a high level signal or constantly a low level signal. To ensure the stability of the entire circuit, the common-mode voltage of the first voltage signal can be maintained at the first value using the comparison voltage signal. The first value may be determined according to the specific practice of the circuit.

In an example, the first voltage signal is a reference voltage signal, and correspondingly, the carrying out a waveform pre-regulation for the input voltage signal specifically comprises performing filtering for the input voltage signal to carry out the waveform pre-regulation for the input voltage signal.

In practical applications, considering that the process deviations and temperatures of various devices or elements in the circuit may cause impacts onto the pulse width of the comparison voltage signal, to prevent such impacts, when the waveform pre-regulation is carried out for the input voltage signal, the method may further comprise regulating the waveform of a fourth voltage signal by regulating the common-mode voltage of the fourth voltage signal to a preset value, and obtaining the first voltage signal, wherein the fourth voltage signal is a voltage signal after the filtering circuit performs filtering, and clamping the first voltage signal by pulling up or pulling down the current of the first voltage signal using the comparison voltage signal output by the comparing circuit, to further regulate the waveform of the first voltage signal, such that the pulse width of the output voltage signal satisfies the first predetermined condition.

As seen from the above description, in the signal receiving method according to an embodiment of the present subject matter, the signal receiving circuit can receive an input voltage signal, carry out waveform shaping for the input voltage signal, and output an output voltage signal.

The pulse width of the output voltage signal can satisfy a first predetermined condition, such that the input voltage signal may be correctly identified using the output voltage signal.

For example, using the circuit of FIG. 1, when the input pattern of the input voltage signal is the first input pattern (PATTERN 1) as illustrated in FIG. 2, the applied direct current compensation voltage (DC Offset) can be −250 mV, and when the input pattern of the input voltage signal is the second input pattern (PATTERN 2) as illustrated in FIG. 2, the applied direct current compensation voltage (DC Offset) can be 250 mV.

Figure 14A:
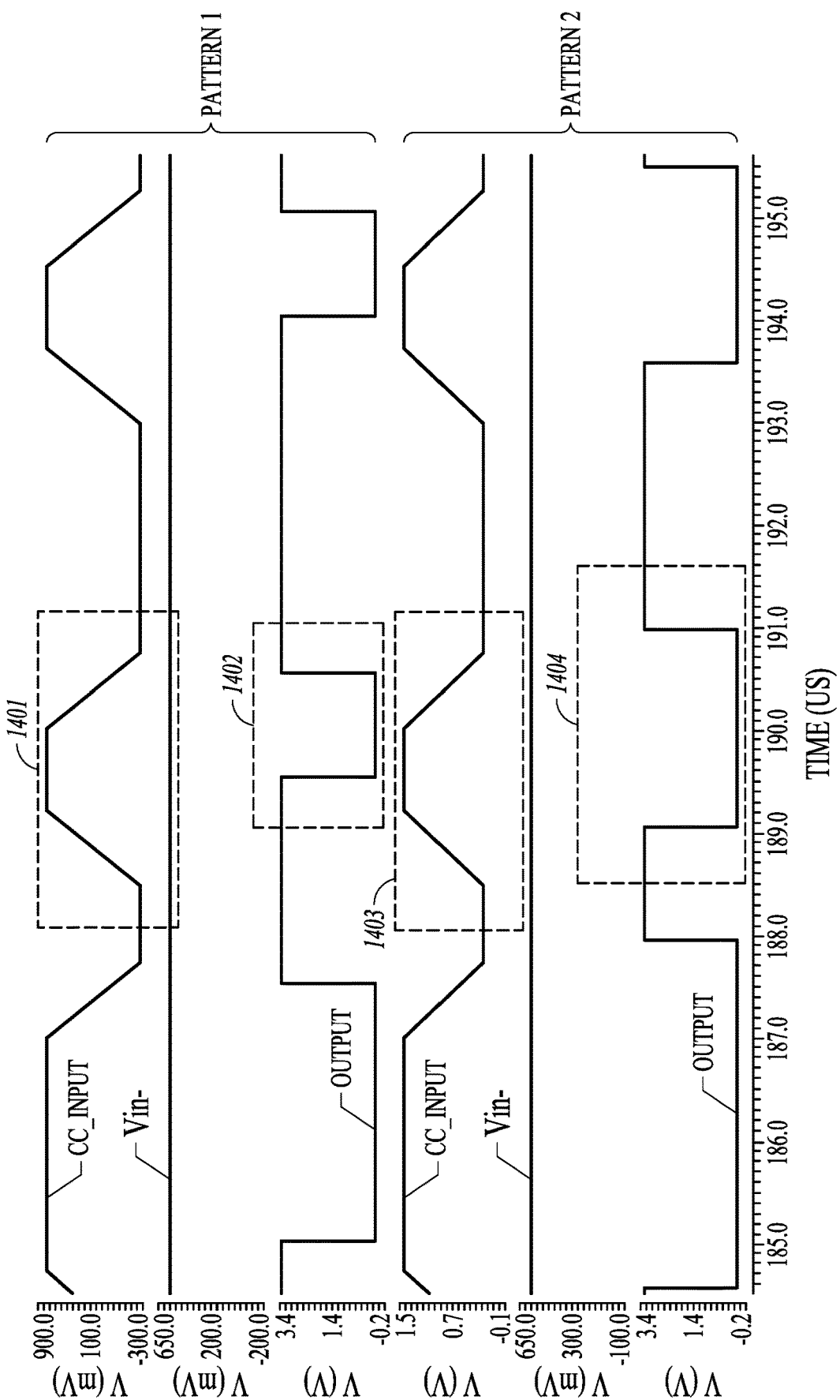
FIG. 14A illustrates an output voltage signal of the circuit as illustrated in FIG. 1 with an input voltage signal and a reference voltage of a comparator according to an embodiment.

FIG. 14A illustrates a schematic diagram of variations of an output voltage signal (OUTPUT) of the signal receiving circuit as illustrated in FIG. 1 with an input voltage signal (CC_INPUT) and a reference voltage (Vin−) of a comparator. As seen from FIG. 14A, when the input pattern is the first input pattern (PATTERN 1) as illustrated in FIG. 2, the pulse width of the input voltage signal (CC_INPUT) is 1.5 μs, and the pulse width of the output voltage signal (OUTPUT) is 1.01 μs. When the input pattern is the second input pattern (PATTERN 2) as illustrated in FIG. 2, the pulse width of the input voltage signal (CC_INPUT) is 1.5 μs, and the pulse width of the output voltage signal (OUTPUT) is 1.91 μs. In these two input patterns, the variation percentages of the pulse widths of the output voltage signal (OUTPUT) are respectively: (1.5−1.01)/1.5×100%=33%, (1.91−1.5)/1.5×100%=27%.

Figure 14B:
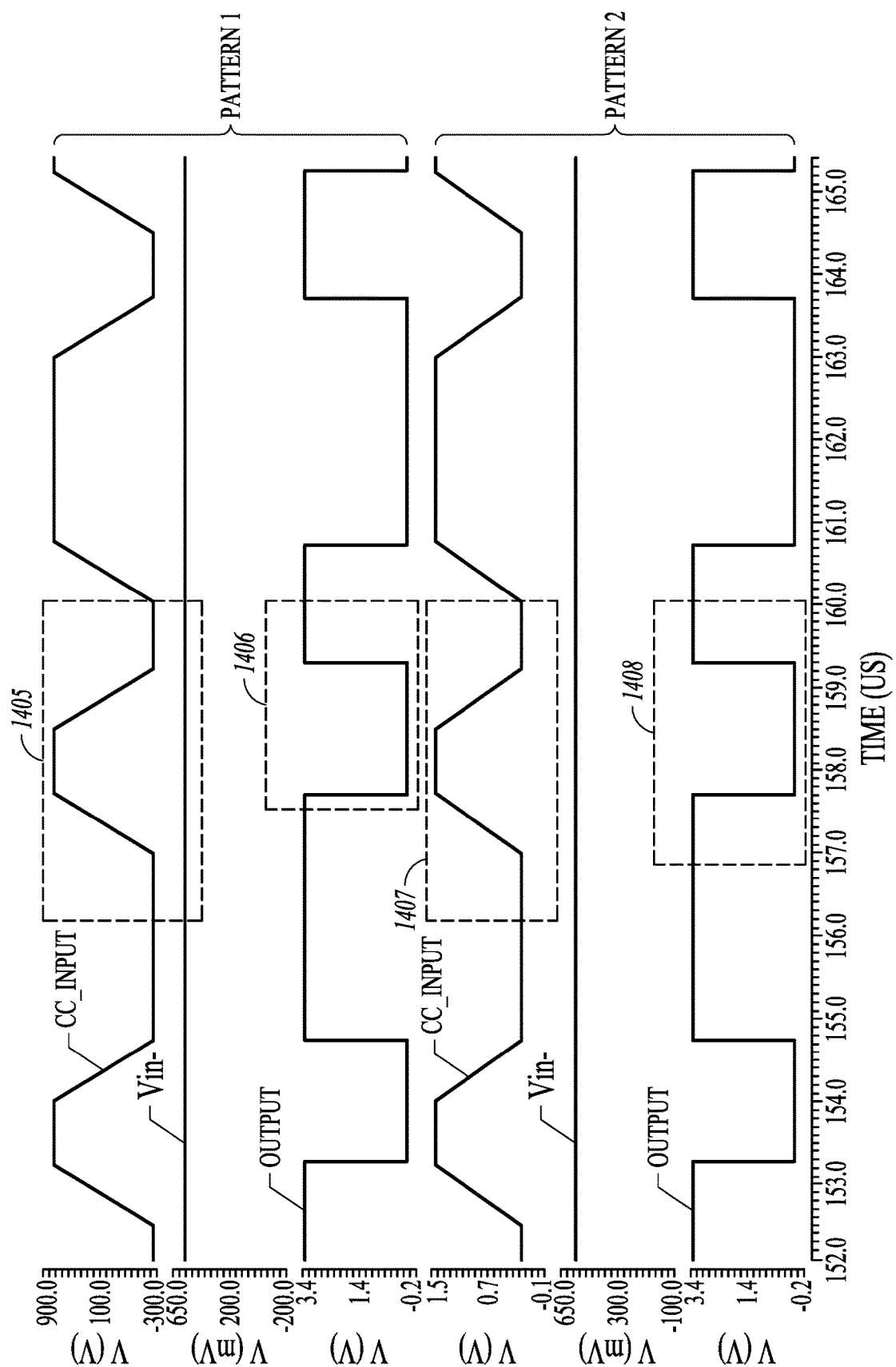
FIG. 14B illustrates an output voltage signal of the circuit as illustrated in FIG. 6 with an input voltage signal and a reference voltage of a comparator according to an embodiment.

FIG. 14B illustrates a schematic diagram of variations of an output voltage signal (OUTPUT) of the signal receiving circuit as illustrated in FIG. 6 with an input voltage signal (CC_INPUT) and a reference voltage (Vin−) of a comparator. As seen from FIG. 14B, when the input pattern is the first input pattern (PATTERN 1) as illustrated in FIG. 2, the pulse width of the input voltage signal (CC_INPUT) is 1.5 μs, and the pulse width of the output voltage signal (OUTPUT) is 1.52 μs. When the input pattern is the second input pattern (PATTERN 2) as illustrated in FIG. 2, the pulse width of the input voltage signal (CC_INPUT) is 1.5 μs, and the pulse width of the output voltage signal (OUTPUT) is 1.52 μs. In these two input patterns, the variation percentages of the pulse widths of the output voltage signal (OUTPUT) are respectively: (1.52−1.5)/1.5×100%=1.3%, (1.52−1.5)/1.5×100%=1.3%.

Figure 14C:
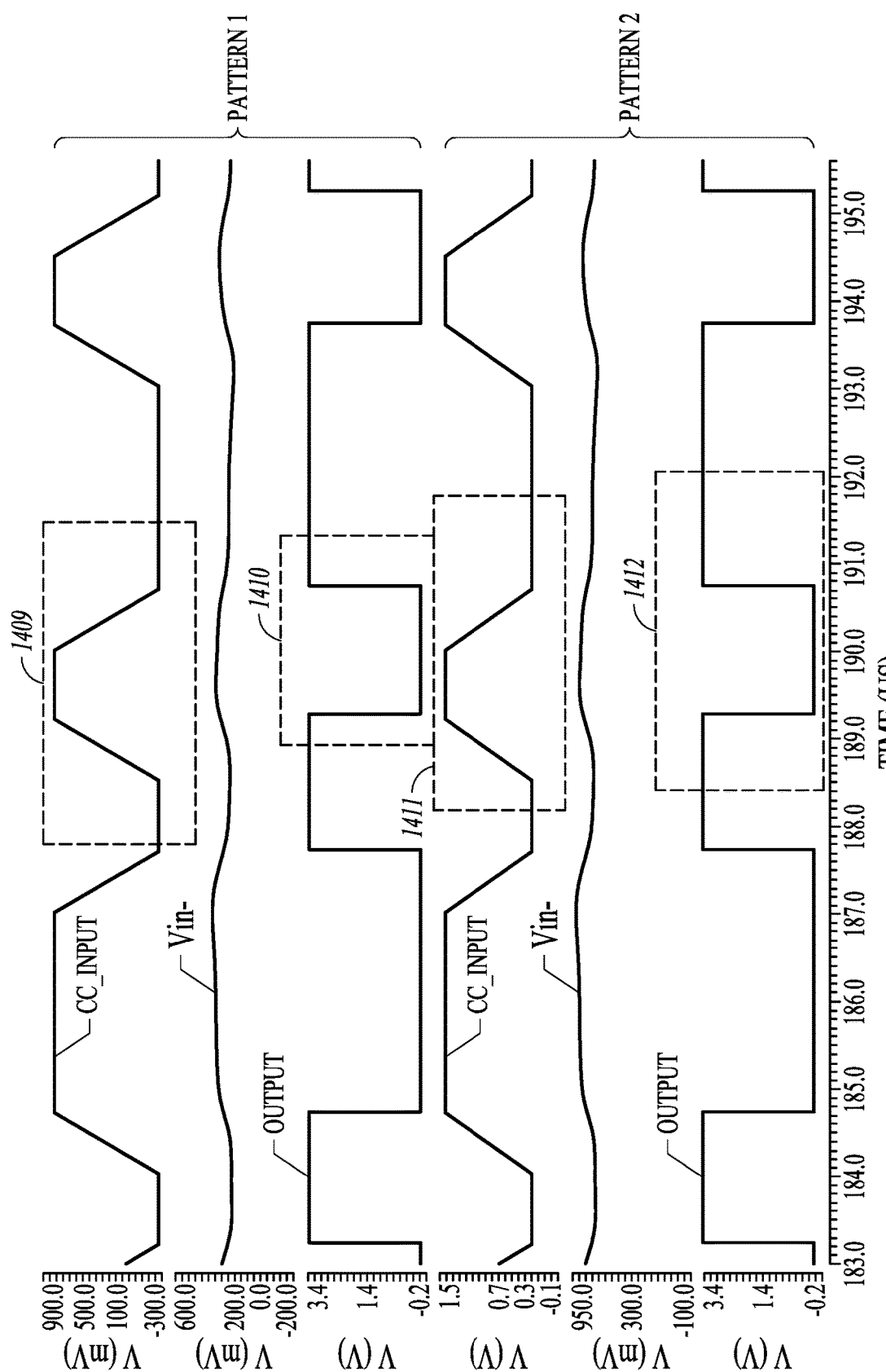
FIG. 14C illustrates an output voltage signal of the circuit as illustrated in FIG. 10 with an input voltage signal and a reference voltage of a comparator according to an embodiment.

FIG. 14C illustrates a schematic diagram of variations of an output voltage signal (OUTPUT) of the signal receiving circuit as illustrated in FIG. 10 with an input voltage signal (CC_INPUT) and a reference voltage (Vin−) of a comparator. As seen from FIG. 14C, when the input pattern is the first input pattern (PATTERN 1) as illustrated in FIG. 2, the pulse width of the input voltage signal (CC_INPUT) is 1.5 μs, and the pulse width of the output voltage signal (OUTPUT) is 1.47 μs. When the input pattern is the second input pattern (PATTERN 2) as illustrated in FIG. 2, the pulse width of the input voltage signal (CC_INPUT) is 1.5 μs, and the pulse width of the output voltage signal (OUTPUT) is 1.52 μs. In these two input patterns, the variation percentages of the pulse widths of the output voltage signal (OUTPUT) are respectively: (1.5−1.47)/1.5×100%=2%, (1.52−1.5)/1.5×100%=1.3%.

As seen from the experimental result, in the signal receiving circuit according to the embodiments of the present subject matter, the variation percentage of the pulse width of the output voltage signal (OUTPUT) is far less than the variation percentage of the pulse width of the output voltage signal (OUTPUT) in the signal receiving circuit as illustrated in FIG. 1. This indicates that the pulse width of the voltage signal (OUTPUT) output by the signal receiving circuit according to the embodiments of the present subject matter is substantially the same as the pulse width of the input voltage signal, and almost does not change with the change of the input pattern of the input voltage signal.

The above embodiments are merely preferred embodiments of the present subject matter, and are not intended to limit the protection scope of the present subject matter.

Additional Notes

An example (e.g., "Example 1") of subject matter (e.g., a system) may include a signal receiving circuit configured to receive an input voltage signal, the signal receiving circuit comprising an input voltage regulating circuit, configured to provide waveform pre-regulation of the input voltage signal to obtain a first voltage signal, and a comparing circuit, configured to compare the first voltage signal with a second voltage signal, and output a first comparison voltage signal having a pulse width that satisfies a first predetermined condition indicative that the input voltage signal is correctly identifiable.

In Example 2, the subject matter of Example 1 may optionally be configured such that the comparing circuit comprises a positive input terminal configured to receive the first voltage signal and a negative input terminal configured to receive the second voltage signal, and the input voltage regulating circuit comprises an alternating current coupling circuit configured to provide alternating current coupling to the input voltage signal, wherein the waveform pre-regulation includes the alternating current coupling.

In Example 3, the subject matter of any one or more of Examples 1-2 may optionally be configured such that the second voltage signal is a reference voltage signal.

In Example 4, the subject matter of any one or more of Examples 1-3 may optionally be configured such that the comparing circuit comprises a negative input terminal configured to receive the first voltage signal and a positive input terminal configured to receive the second voltage signal, and the input voltage regulating circuit comprises a filtering circuit configured to filter the input voltage signal, wherein the waveform pre-regulation includes the filtering.

In Example 5, the subject matter of any one or more of Examples 1-4 may optionally be configured such that the second voltage signal is the input voltage signal.

In Example 6, the subject matter of any one or more of Examples 1-5 may optionally be configured to comprise a digital detecting circuit configured to determine if the input voltage signal is correct using the comparison voltage signal.

An example (e.g., "Example 7") of subject matter (e.g., a system) may include means for receiving an input voltage signal, means for providing waveform pre-regulation of the input voltage signal to obtain a first voltage signal, and means for comparing the first voltage signal with a second voltage signal, and outputting a first comparison voltage signal having a pulse width that satisfies a first predetermined condition indicative that the input voltage signal is correctly identifiable.

In Example 8, the subject matter of any one or more of Examples 1-8 may optionally be configured such that the means for providing waveform pre-regulation of the input voltage signal to obtain the first voltage signal includes means for providing alternating current coupling to the input voltage signal.

In Example 9, the subject matter of any one or more of Examples 1-8 may optionally be configured such that the means for providing waveform pre-regulation of the input voltage signal to obtain the first voltage signal includes means for filtering the input voltage signal.

In Example 10, the subject matter of any one or more of Examples 1-9 may optionally be configured such that the means for receiving the input voltage signal includes a signal receiving circuit, the means for providing waveform pre-regulation of the input voltage signal to obtain the first voltage signal includes an input voltage regulating circuit, and the means for comparing the first voltage signal with the second voltage signal, and outputting the first comparison voltage signal includes a comparing circuit.

In Example 11, the subject matter of any one or more of Examples 1-10 may optionally be configured such that the comparing circuit comprises a positive input terminal configured to receive the first voltage signal and a negative input terminal configured to receive the second voltage signal, and the input voltage regulating circuit comprises an alternating current coupling circuit configured to provide alternating current coupling to the input voltage signal, wherein the waveform pre-regulation includes the alternating current coupling.

In Example 12, the subject matter of any one or more of Examples 1-11 may optionally be configured such that the second voltage signal is a reference voltage signal.

In Example 13, the subject matter of any one or more of Examples 1-12 may optionally be configured such that the comparing circuit comprises a negative input terminal configured to receive the first voltage signal and a positive input terminal configured to receive the second voltage signal, and the input voltage regulating circuit comprises, a filtering circuit configured to filter the input voltage signal, wherein the waveform pre-regulation includes the filtering.

In Example 14, the subject matter of any one or more of Examples 1-13 may optionally be configured such that the second voltage signal includes the input voltage signal.

An example (e.g., "Example 15") of subject matter (e.g., a method) may include receiving an input voltage signal at a signal receiving circuit, the signal receiving circuit comprising an input voltage regulating circuit and a comparing circuit, providing waveform pre-regulation of the input voltage signal to obtain a first voltage signal using the input voltage regulating circuit, and comparing the first voltage signal with a second voltage signal, and outputting a first comparison voltage signal having a pulse width that satisfies a first predetermined condition indicative that the input voltage signal is correctly identifiable using the comparing circuit.

In Example 16, the subject matter of any one or more of Examples 1-15 may optionally be configured to include receiving the first voltage signal at a positive input terminal of the comparing circuit, receiving the second voltage signal at a negative input terminal of the comparing circuit, and providing alternating current coupling to the input voltage signal using an alternating current coupling circuit, wherein the input voltage regulating circuit includes the alternating current coupling circuit, and wherein the providing waveform pre-regulation includes the providing alternating current coupling.

In Example 17, the subject matter of any one or more of Examples 1-16 may optionally be configured to comprise such that the second voltage signal includes a reference voltage signal.

In Example 18, the subject matter of any one or more of Examples 1-17 may optionally be configured such that receiving the first voltage signal at a negative input terminal of the comparing circuit, receiving the second voltage signal at a positive input terminal of the comparing circuit, and filtering the input voltage signal using a filtering circuit, wherein the input voltage regulating circuit includes the filtering circuit, and wherein the providing waveform pre-regulation includes the filtering.

In Example 19, the subject matter of any one or more of Examples 1-18 may optionally be configured such that the second voltage signal includes the input voltage signal.

In Example 20, the subject matter of any one or more of Examples 1-19 may optionally be configured such that determining if the input voltage signal is correct using the comparison voltage signal includes using a digital detecting circuit An example (e.g., "Example 21") of subject matter (e.g., a system or apparatus) may optionally combine any portion or combination of any portion of any one or more of Examples 1-20 to include "means for" performing any portion of any one or more of the functions or methods of Examples 1-20, or a "machine-readable medium" (e.g., non-transitory, etc.) including instructions that, when performed by a machine, cause the machine to perform any portion of any one or more of the functions or methods of Examples 1-20.

The above descriptions are merely specific implementation manners of the present invention, the protection scope of the present invention is not limited thereto, and variations or replacements that can be easily derived by persons skilled in the art without departing from the technical scope disclosed in the present invention shall fall within the protection scope of the present invention. Therefore, the protection scope of the present invention shall be subject to the protection scope of the claims.

The above descriptions include references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. If two elements are shown in the drawings with a line connecting them, the two elements can be either be coupled, or directly coupled, unless otherwise indicated. If two elements are coupled, one or more intervening elements may be present. In contrast, in embodiments where an element is referred to as "directly coupled" to another element, there can be no intervening elements in those embodiments.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system comprising:
   a signal receiving circuit configured to receive an input voltage signal from an input terminal, the input voltage signal having a plurality of pulses according to a first input pattern or a second input pattern, the signal receiving circuit including:
   an input voltage regulating circuit including an alternating current (AC) coupling circuit, a common-mode voltage generating circuit, and a feedback clamping circuit, the AC coupling circuit being connected to the input terminal, the AC coupling circuit configured to modify a waveform shape of the input voltage signal to obtain a regulated voltage signal, the common-mode voltage generating circuit including a first resistor, a second resistor, and a node disposed between the first resistor and the second resistor, the node being coupled to the AC coupling circuit, the feedback clamping circuit including a first current source, a second current source, and an inverter; and
   a comparing circuit configured to compare the regulated voltage signal with a reference voltage signal, the comparing circuit configured to generate a comparison voltage signal in response to the comparison, the inverter configured to receive the comparison voltage signal,
   the input voltage regulating circuit configured to adjust a current of the input voltage signal, in response to the comparison signal, to obtain the regulated voltage signal such that the comparison voltage signal has a pulse width that is substantially the same regardless of whether the input voltage signal includes the first input pattern or the second input pattern.

2. The system of claim 1, wherein the signal receiving circuit is configured to identify whether the input voltage signal is a correct signal based on the comparison voltage signal.

3. The system of claim 1, wherein the second input pattern has a high voltage value that is different from a high voltage value of the first input pattern, and the second input pattern has a low voltage value that is different from a low voltage value of the first input pattern.

4. The system of claim 1, wherein the input terminal includes a common collector (CC) pin, the second input pattern having a high voltage different from a high voltage of the first input pattern, the second input pattern having a low voltage different from a low voltage of the first input pattern.

5. The system of claim 1, wherein the regulated voltage signal includes a plurality of pulses, at least one of the plurality of pulses having a first edge and a second edge, wherein a magnitude of the first edge is different than a magnitude of the second edge.

6. The system of claim 1, wherein the input voltage signal includes an analog voltage signal including at least one data signal or at least one clock signal.

7. The system of claim 1, wherein the AC coupling circuit includes a capacitor having a first terminal and a second terminal, the first terminal being coupled to the input terminal, the second terminal being coupled to the node, the node being coupled to an input of the comparing circuit that receives the regulated voltage signal.

8. A system comprising:
a signal receiving circuit configured to receive an input voltage signal from an input terminal, the input voltage signal having a plurality of pulses according to a first input pattern or a second input pattern, the second input pattern being different than the first input pattern, the signal receiving circuit including:
an input voltage regulating circuit including an alternating circuit (AC) coupling circuit, a common-mode voltage generating circuit, and a feedback clamping circuit, the AC coupling circuit including a capacitor, the capacitor being connected to the input terminal, the AC coupling circuit configured to modify a waveform shape of the input voltage signal to obtain a regulated voltage signal, the common-mode voltage generating circuit configured to generate a substantially constant common mode voltage of the regulated voltage signal, the common-mode voltage generating circuit including a first resistor, a second resistor, and a node disposed between the first resistor and the second resistor, the node being coupled to the capacitor, the feedback clamping circuit including a first current source, a second current source, and an inverter; and
a comparing circuit configured to compare the regulated voltage signal with a reference voltage signal, the comparing circuit configured to generate a comparison voltage signal in response to the comparison, the inverter configured to receive the comparison voltage signal,
the input voltage regulating circuit configured to receive the comparison voltage signal, the input voltage regulating circuit configured to adjust a current of the input voltage signal, in response to the comparison voltage signal, to obtain the regulated voltage signal,
the comparison voltage signal defining a first pulse width in response to the input voltage signal having the first input pattern, the comparison voltage signal defining a second pulse width in response to the input voltage signal having the second input pattern the second pulse width being substantially the same as the first pulse width.

9. The system of claim 8, wherein the feedback clamping circuit configured to receive the comparison voltage signal and clamp the regulated voltage signal based on the comparison voltage signal.

10. The system of claim 8, wherein the signal receiving circuit is configured to identify whether the input voltage signal is a correct signal based on the comparison voltage signal.

11. The system of claim 8, wherein the second input pattern has a high voltage value that is different from a high voltage value of the first input pattern, and the second input pattern has a low voltage value that is different from a low voltage value of the first input pattern.

12. The system of claim 8, wherein the input terminal includes a common collector (CC) pin, the second input pattern having a high voltage different from a high voltage of the first input pattern, the second input pattern having a low voltage different from a low voltage of the first input pattern.

13. The system of claim 8, wherein the regulated voltage signal includes a plurality of pulses, at least one of the plurality of pulses having a first edge and a second edge, wherein a magnitude of the first edge is different than a magnitude of the second edge.

14. The system of claim 8, wherein the common-mode voltage generating circuit includes a first switch and a second switch, and the feedback clamping circuit includes a third switch and a fourth switch.

15. The system of claim 8, wherein the capacitor has a first terminal coupled to the input terminal and a second terminal coupled to an input of the comparing circuit.

16. A method comprising:
receiving an analog voltage signal from an input terminal, the analog voltage signal including a first input pattern or a second input pattern, the second input pattern being different than the first input pattern;
modifying, by a capacitor and a common-mode voltage generating circuit, a waveform shape of the analog voltage signal to obtain a regulated voltage signal, the modifying including receiving a comparison voltage signal and adjusting a current of the analog voltage signal, in response to the comparison voltage signal, to obtain the regulated voltage signal, the common-mode voltage generating circuit including a first resistor, a second resistor, and a node disposed between the first resistor and the second resistor, the node being coupled to the capacitor;
clamping, by a feedback clamping circuit, the regulated voltage signal in response to the comparison voltage signal, the feedback clamping circuit including a first current source, a second current source, and an inverter, the inverter configured to receive the comparison voltage signal;
comparing the regulated voltage signal with a reference voltage signal; and
generating the comparison voltage signal in response to the comparison,
the comparison voltage signal defining a first pulse width in response to the input voltage signal having the first input pattern, the comparison voltage signal defining a second pulse width in response to the input voltage signal having the second input pattern, the second pulse width being substantially the same as the first pulse width.

17. The method of claim 16, further comprising:
identifying whether the analog voltage signal is a correct signal based on the comparison voltage signal.

18. The system of claim 1, wherein the common-mode voltage generating circuit is configured to generate a substantially constant common mode voltage of the regulated voltage signal regardless of whether the input voltage signal has the first input pattern or the second input pattern.

19. The system of claim 8, wherein the common-mode voltage generating circuit is configured to generate the substantially constant common mode voltage regardless of whether the input voltage signal has the first input pattern or the second input pattern.

* * * * *